United States Patent [19]
Delporte et al.

[11] Patent Number: 5,814,203
[45] Date of Patent: Sep. 29, 1998

[54] PROCESS TO DECREASE THE STRENGTH OF AN ELECTRIC FIELD PRODUCED BY A HIGH VOLTAGE CONDUCTIVE PATH OF A PRINTED CIRCUIT BOARD AND PRINTED CIRCUIT ASSEMBLY USING SAME

[75] Inventors: Pascal Gaston Raymond Delporte, Pont-à-Celles; Pierre Paul Roger Willy Depireux, Charleroi, both of Belgium

[73] Assignee: Alcatel N.V., Netherlands

[21] Appl. No.: 563,622

[22] Filed: Nov. 28, 1995

[30] Foreign Application Priority Data

Dec. 12, 1994 [EP] European Pat. Off. .............. 94203604

[51] Int. Cl.$^6$ ....................................................... C25D 5/50
[52] U.S. Cl. ............................................ 205/226; 205/125
[58] Field of Search ................................... 205/225, 226, 205/227, 125

[56] References Cited

U.S. PATENT DOCUMENTS 3,745,095  7/1973  Chadwick et al. ...................... 204/125
4,804,615  2/1989  Larson et al. ............................... 4/226

FOREIGN PATENT DOCUMENTS 2502900  7/1976  Germany .

OTHER PUBLICATIONS

Patent Abstracts of Japan, vol. 16, No. 108 (E–1179) 17 Mar. 1992 & JP–A–03 283 586 (Toshiba Lighting & Technol. Corp.) 13 Dec. 1991.

*Primary Examiner*—Kathryn L. Gorgos
*Assistant Examiner*—Kishor Mayekar
*Attorney, Agent, or Firm*—Ware, Fressola, Van Der Sluys & Adolphson LLP

[57] ABSTRACT

A process to decrease the strength of an electric field produced by a high voltage conductive path on a printed circuit board and printed circuit assembly using same includes the steps of coating the upper side (5) of the conductive path or track (1) with a thick layer of electrically conductive coating material (4); and reflowing so that the upper edges (8, 9) of the track (1) are also covered with a relatively thick layer of coating material. The track (1) is thus embedded in a mass of coating material having more or less a rounded-shaped cross-section and the sharp upper edges (8, 9) of this track, where a strong electrical field is generally produced, are smoothed. As a result, the strength of the electrical field around the track (1) is reduced. In a preferred embodiment, a second track (13) similar to the first track (1) is created symmetrically thereto on the opposite surface (14) of the printed circuit board (3). This second track (13) is brought to the same potential as the first track (1) and is coated in a same way. Therefore, the electrical fields still produced at the lower edges (10, 11) of the track (1), which are not totally embedded in the mass of coating material because the latter do not adhere on the surface (2) of the printed circuit board (3), are counterbalanced by the electrical fields produced at corresponding opposite edges (15, 16) of the second track (13). The strength of the global electrical field around the tracks (1, 13) is thereby drastically reduced.

8 Claims, 2 Drawing Sheets

PROCESS TO DECREASE THE STRENGTH OF AN ELECTRIC FIELD PRODUCED BY A HIGH VOLTAGE CONDUCTIVE PATH OF A PRINTED CIRCUIT BOARD AND PRINTED CIRCUIT ASSEMBLY USING SAME

TECHNICAL FIELD

The present invention relates to a process to decrease the strength of an electric field produced by a high voltage conductive path on an upper surface of a printed circuit board, said conductive path having a substantially rectangular shaped cross-section with an upper side, upper edges, lateral sides, lower edges and a lower side, said lower side and lower edges being located against said upper surface of said printed circuit board, and said process including the steps of:

coating said upper side of said conductive path with a layer of electrically conductive coating material; and reflowing so that said coating material also covers said upper edges and said lateral sides of said conductive path.

BACKGROUND OF THE INVENTION

Such a process is well known in the art and is used to cover all accessible parts of the conductive path on the printed circuit board with a relatively thin layer of coating material in order to protect it and to facilitate subsequent soldering. Because of its rectangular cross-section, the conductive path shows sharp edges which also appear at the external surface or envelope of the coated conductive path. It is further also well known that near a sharp edge the strength of the electrical field may be very high when a high voltage is applied to the corresponding conductive path. Such a high electrical field may damage circuits on the printed circuit board or other electronic components.

SUMMARY OF THE INVENTION

An object of the present invention is to provide a process of the above known type but by which the strength of the electrical field produced around the conductive path is dramatically reduced.

According to the invention, this object is achieved due to the fact that said coating step consists in depositing a relatively thick layer of said coating material on said upper side of said conductive path so that, after said reflowing step, said upper edges are covered with a relatively thick layer of said coating material.

In this way, by using a relatively thick layer of coating material, generally twice as thick as normal, the cross-section of the coated conductive path has no longer a rectangular shape similar to that of the conductive path itself but is rather curved and resembles to a portion of a circle. Because the above upper edges of the conductive path are thus smoothed owing to the mass of coating material embedding this conductive path, the strength of the electrical field around this path is drastically reduced.

The present process reduces the strength of the electrical field produced near to the upper edges of the coated conductive path. However, the lower edges of this path, i.e. the edges located against the upper surface of the printed circuit board, are still relatively sharp because no coating material adheres on the upper surface of the board. A relatively high electrical field is thus also present there.

Therefore, in a preferred embodiment of the present invention, said process also includes the steps of realising a second conductive path similar to the first mentioned conductive path and symmetrical thereto on the lower surface, opposite to said upper surface, of said printed circuit board, of bringing said first and second conductive paths to the same potential, and of coating said first and second conductive paths in the same way with said coating material.

In this way, the overall cross-section of the two coated conductive paths symmetrically located on both surfaces of the printed circuit board resembles a complete circle without any sharp edge. In fact, the electrical fields generated at the lower edges of the first conductive path are counterbalanced by equivalent electrical fields generated at the corresponding lower angles of the identical and equipotential second conductive path on the opposite surface of the printed circuit board.

The present invention also relates to a printed circuit assembly including a printed circuit board with, at an upper surface thereof, a high voltage conductive path having a substantially rectangular shaped cross-section with an upper side, upper edges, lateral sides, lower edges and a lower side, said lower side and lower edges being located against said upper surface of said printed circuit board, and said upper side, said upper edges and said lateral sides of said conductive path being coated with a layer of electrically conductive coating material.

Such a printed board assembly is well known in the art and all the accessible parts of the conductive path on the printed circuit board are covered with a relatively thin layer of coating material in order to protect it and to facilitate subsequent soldering. Because of its rectangular cross-section, the conductive path shows sharp edges which also appear at the external surface or envelope of the coated conductive path. It is further also well known that near a sharp edge the strength of the electrical field may be very high when a high voltage is applied to the corresponding conductive path. Such a high electrical field may damage circuits on the printed circuit board or other electronic components.

An object of the present invention is to provide a printed circuit assembly of the above known type but by which the strength of the electrical field produced around the conductive path is dramatically reduced.

According to the invention, the object is achieved due to the fact that said upper edges of said conductive path are covered with a relatively thick layer of said coating material.

Owing to the relatively thick layer of coating material, generally twice as thick as normal, the cross-section of the coated conductive path has no longer a rectangular shape similar to that of the conductive path itself but is rather curved and resembles a portion of a circle. Because the above upper edges of the conductive path are thus smoothed by the mass of coating material embedding this conductive path, the strength of the electrical field around this path is drastically reduced.

In the present printed circuit assembly, the strength of the electrical field produced near to the upper edges of the coated conductive path is reduced. However, the lower edges of this path, i.e. the edges located against the upper surface of the printed circuit board, are still relatively sharp because no coating material adheres on the upper surface of the board. A relatively high electrical field is thus also present there.

Therefore, in a preferred embodiment, said printed circuit board is provided with a second conductive path similar to the first mentioned conductive path and symmetrical thereto on the lower surface, opposite to said upper surface (2), of said printed circuit board. Said first and second conductive paths are at the same potential by means of a conductive strap or the like, and said first and second conductive paths are similarly covered with a relatively thick layer of said coating material.

In this way, the overall cross-section of the two coated conductive paths symmetrically located on both surfaces of the printed circuit board resembles a complete circle without any sharp edge. In fact, the electrical fields generated at the lower edges of the first conductive path are counterbalanced by equivalent electrical fields generated at the corresponding lower angles of the identical and equipotential second conductive path on the opposite surface of the printed circuit board.

It is finally to be noted that the printed circuit assembly of the present invention may be realised by the above mentioned process also according to the present invention.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

BEST MODE FOR CARRYING OUT THE INVENTION

Figure 1:
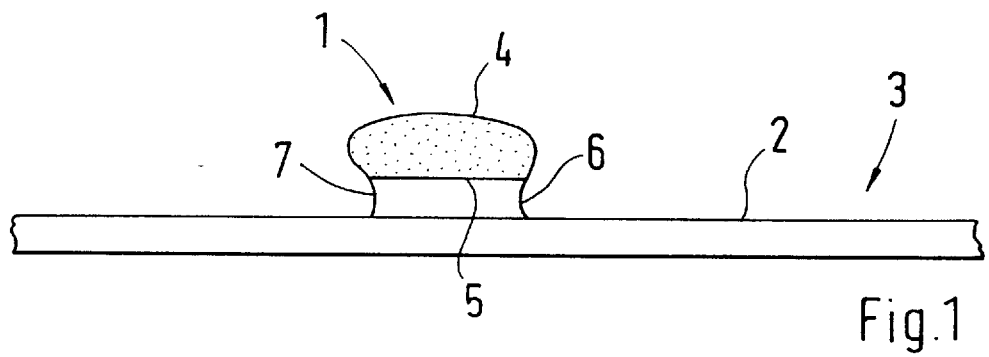
FIGS. 1 to 3 show successive steps of the process according to the present invention.
Figure 2:
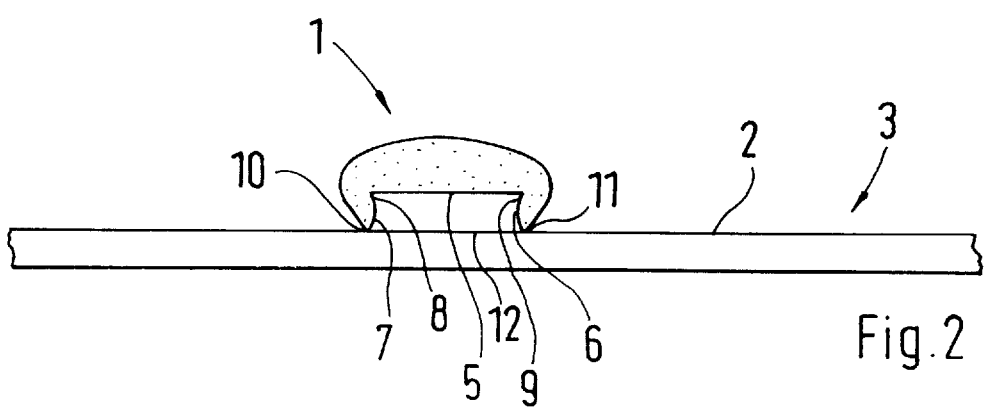
Figure 3:
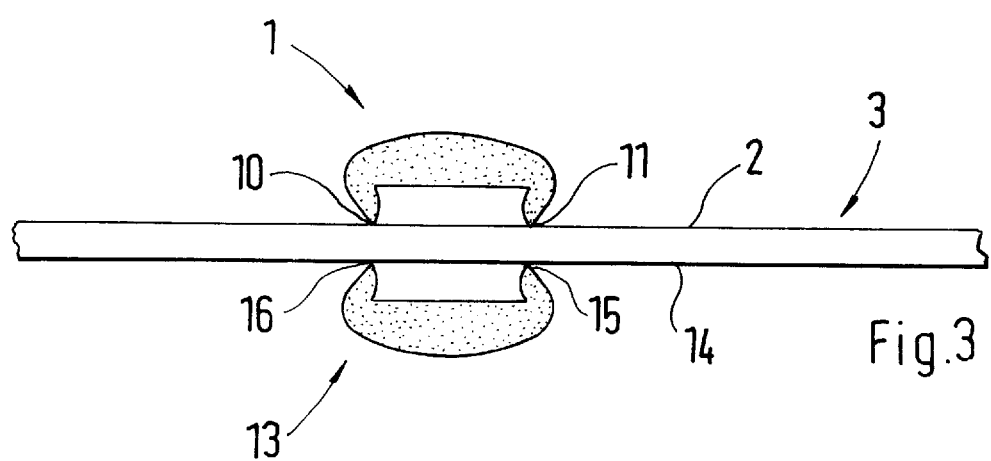

The process described hereafter by making reference to FIGS. 1 to 3 is used to decrease the electric field produced by a high voltage conductive path, generally indicated by reference 1, located on a surface 2 of a printed circuit board generally indicated by reference 3.

The upper surface 2 of the printed circuit board 3 is covered by a layer of copper which is etched to leave only conductive paths or tracks as 1 on this surface 2. To this end, each track 1 is first coated with a tin/lead alloy 4 deposited thereon by means of an electro-plating process. The remaining visible copper is then etched from the surface 2 so that only track 1 with, on its upper side 5, the coating 4 remains on the surface 2.

Due to the etching process, the theoretical rectangular shaped cross-section of the copper track 1 has slightly concave lateral sides 6 and 7 as shown in FIG. 1.

The tin/lead deposit 4 is then cleaned and the copper track 1 deoxidised by "fluxing" the printed board 3 in a bath.

Then, the printed board 3 is pre-heated by immersing it in a hot oil bath whereof the temperature is just below the temperature corresponding to the eutectic point of the tin/lead alloy 4.

This pre-heating step is followed by a reflowing step during which the printed board 3 is immersed in a second hot oil bath having a temperature just above that of the eutectic point. As a consequence, the tin/lead alloy 4 is melted and flows along the lateral sides 6 and 7 of the track 1 in order to cover them as shown in FIG. 2.

The process is then completed by a cooling and a post-cleaning operation.

As it is well known in the art, when a high voltage is applied to the track 1 a high electrical field is produced at the edges, as 8 and 9, of its rectangular shaped cross-section. This high electrical field may damage electronic components located near to the track 1, e.g. on the upper surface 2 of the printed board 3. The strength of this electrical field may however be reduced by smoothing the edges 8 and 9.

To this end, the thickness of the tin/lead coating layer 4 applied to the upper side 5 of the track 1 is chosen twice as thick as normal. In more detail, the thickness of the tin/lead coating layer 4, which is generally of 12.5 micrometer, is now chosen equal to 25 micrometer. As a result, also the layer of coating material covering the lateral sides 6 and 7 as well as the edges 8 and 9 of the track 1 is thicker than normal. This track 1 may thus be seen as being embedded in a mass of coating material of which the external envelope of the cross-section has more or less the shape of a portion of a circle. The edges 8 and 9 of the track 1 are thus masked by the mass of coating material and there are no longer sharp edges appearing on the external envelope of this coated track. As a result, the strengths of the electrical fields near to the edges 8 and 9 are drastically reduced.

Although, when a high voltage is applied to the track 1, the strengths of the electrical fields produced near to the upper edges 8 and 9 of the rectangular cross-section of this track 1 are reduced by covering the track with a thick layer of coating material, the same is not true for the lower edges 10 and 11 of this rectangular cross-section. Indeed, these lower edges 10 and 11 which are located, together with the lower side 12 of the rectangular cross-section of the track 1, on the upper surface 2 of the board 3 are not totally embedded in the above mass of coating material because this material does not adhere on the surface 2 of the board 3. As a consequence, the coated track still shows sharp edges 10 and 11 near to which the strength of the electrical field may cause damages on neighbouring electronic components.

Figure 4:
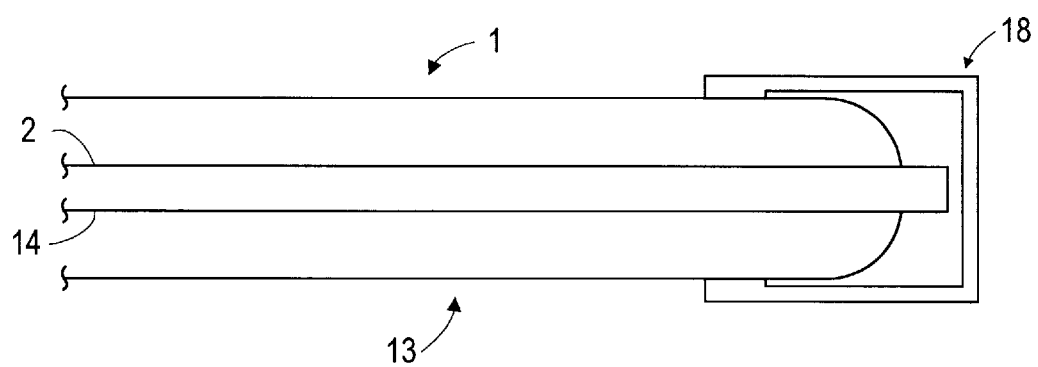
FIG. 4 is view of the two tracks shown in FIG. 3 taken along line 4—4 of FIG. 3 showing a short-circuiting strap added for maintaining the two tracks at the same electrical potential.

Again to reduce the strength of the electrical field near to the conductive track 1, a preferred embodiment of the present invention is shown in FIG. 3. Therein, a second track, generally indicated by 13, is created on the lower surface 14 of the printed circuit board 3. This lower surface 14 is opposite to the upper surface 2 and the location and shape of the second track 13 is symmetrical to that of the first track 1 with respect to the board 3. The two tracks 1 and 13 are further brought to the same potential, e.g. by a short-circuiting strap 18 as seen in FIG. 4. The strap can be attached by soldering to tracks 1 and 13 or by other conventional fastening techniques.

Since the two tracks 1 and 13 are at the same potential and at the opposite surfaces 2 and 14 of the board 3, they produce identical and opposite electrical fields. As a result, the above remaining strong electrical fields produced at the lower edges 10 and 11 of track 1 are now counterbalanced by the electrical fields produced at the corresponding lower edges 15 and 16 of track 13. In other words, the global cross-section of the two track 1 and 13 looks more or less like a circle and the strength of the whole local electrical field around these tracks is reduced.

While the principles of the invention have been described above in connection with specific apparatus, it is to be clearly understood that this description is made only by way of example and not as a limitation on the scope of the invention.

We claim:
1. A process to electrochemically apply electrically conductive coating material (4) to a conductive path (1) on an upper surface (2) of a printed circuit board (3) to decrease the strength of an electric field produced around the con- ductive path (1) on the upper surface (2) of the printed circuit board (3) when a voltage is applied to the conductive path (1), said conductive path having a substantially rectangular shaped cross-section with an upper side (5), upper edges (8, 9), lateral sides (6, 7), lower edges (10, 11) and a lower side (12), said lower side and lower edges being located against said upper surface of said printed circuit board, and said process including the steps of:

electrochemically coating said upper side (5) of said conductive path with a layer of electrically conductive coating material (4); and reflowing said coating material to cover said upper edges and said lateral sides of said conductive path, wherein said coating step consists of depositing a layer of said coating material (4) of a thickness at least approximately twice as thick as that of a conventional layer of approximately 12 $\mu$m on said upper side (5) of said conductive path (1) such that, after said reflowing step, said upper edges (8, 9) are covered with the layer of said reflowed coating material; so that when a voltage is applied to the conductive path (1), the strength of the electric field produced around the conductive path is decreased compared to the strength of the electric field around the conductive path that would be produced by the same voltage if the layer of coating material was not as thick.

2. A process according to claim 1, further including the steps of providing another conductive path (13) similar to the conductive path (1) and symmetrical thereto on the lower surface (14), opposite to said upper surface (2) of said printed circuit board (3), bringing both conductive paths to a same potential, and coating said another conductive path (13) in the same way with said coating material (4) while coating the conductive path (1).

3. A process according to claim 2, wherein said coating material (4) is deposited on said conductive path (1) by an electroplating process.

4. A process according to claim 2, wherein said conductive path (1) is made of copper, in that said coating material (4) is a tin-lead alloy, and in that said reflowing step is performed at a temperature corresponding to the eutectic point of said alloy.

5. A process according to claim 4, wherein prior to said reflowing step, the coated conductive path is pre-heated by immersing said printed circuit board (3) in a first heated oil bath at a temperature below said temperature corresponding to the eutectic point of said alloy (4).

6. A process according to claim 5, wherein said reflowing step is performed by immersing said printed circuit board (3) in a second heated oil bath at a temperature above said temperature corresponding to the eutectic point of said alloy (4).

7. A process according to claim 5, wherein prior to the pre-heating step, said coated conductive path is pre-cleaned by immersing said printed circuit board (3) in a cleaning bath.

8. A process according to claim 7, wherein after said reflowing step, said coated conductive path is cooled and post-cleaned.

\* \* \* \* \*

UNITED STATES PATENT AND TRADEMARK OFFICE
CERTIFICATE OF CORRECTION

PATENT NO. : 5,814,203
DATED : September 29, 1998
INVENTOR(S) : Pascal Gaston Raymond Delporte
Pierre Paul Rogery Willy Depireux It is certified that error appears in the above-identified patent and that said Letters Patent is hereby corrected as shown below:

On the title page, item [54] and in column 1,

"Process to Decrease the Strength of an Electric Field Produced by a High Voltage Conductive Path of a Printed Circuit Board and Printed Circuit Assembly Using Same"

should be --Process to Decrease the Strength of an Electric Field Produced by a High Voltage Conductive Path on a Printed Circuit Board and Printed Circuit Assembly Using Same--.

[56] On the Title Page, "4/226" should be --204/226--.

Signed and Sealed this

Sixteenth Day of March, 1999

Attest:

Q. TODD DICKINSON

*Attesting Officer*     *Acting Commissioner of Patents and Trademarks*